United States Patent [19]
Nobel et al.

[11] Patent Number: 5,610,642
[45] Date of Patent: Mar. 11, 1997

[54] FLEX CIRCUIT WITH MULTIPLE TRACE CONFIGURATIONS AND METHOD OF MANUFACTURE

[75] Inventors: Gary M. Nobel, San Diego, Calif.; Todd Medin, Vancouver, Wash.; Arthur K. Wilson, San Diego; Patricia S. Brown, Encinitas, both of Calif.

[73] Assignee: Hewlett-Packard Company, Palo Alto, Calif.

[21] Appl. No.: 234,909

[22] Filed: Apr. 28, 1994

Related U.S. Application Data

[63] Continuation-in-part of Ser. No. 55,615, Apr. 30, 1993, abandoned.

[51] Int. Cl.⁶ .................................................... B41J 2/01
[52] U.S. Cl. ............................ 347/50; 361/749; 439/67
[58] Field of Search ................... 347/50, 49; 439/67, 439/77; 361/749, 789

[56] References Cited

U.S. PATENT DOCUMENTS

| | | | |
|---|---|---|---|
| 3,113,248 | 12/1963 | Friedman | 361/749 |
| 4,709,248 | 11/1987 | Piatt et al. | 347/14 |
| 4,775,868 | 10/1988 | Sugiura | 346/46 |
| 4,872,027 | 10/1989 | Buskirk | 347/49 |
| 5,315,472 | 5/1994 | Fong et al. | 361/212 |

*Primary Examiner*—John E. Barlow, Jr.

[57] ABSTRACT

A versatile flexible interconnect circuit for use with an inkjet printer. The inventive flexible interconnect circuit comprises a unitary flexible substrate having a first end and a second end. A first plurality of contacts is arranged on the first end of the substrate in a first configuration. A first plurality of conductive traces connects the first plurality of contacts to a second plurality of contacts disposed on the second end of the substrate. A third plurality of contacts is arranged on the first end of the substrate in a second configuration. A second plurality of conductive traces connects the third plurality of contacts to a fourth plurality of contacts disposed on the second end of the substrate. In a specific embodiment, the first plurality of contacts includes plural electrical ground contacts and the first plurality of conductive traces includes a conductive trace which connects the electrical ground contacts. The inventive flex circuit allows for the use of pens with different contact configurations in a single inkjet printer.

6 Claims, 12 Drawing Sheets

FLEX CIRCUIT WITH MULTIPLE TRACE CONFIGURATIONS AND METHOD OF MANUFACTURE

This is a continuation-in-part of U. S. patent application Ser. No. 08/055,615, entitled UNITARY INTERCONNECT SYSTEM FOR AN INKJET PRINTER, filed Apr. 30, 1993 by A. K. Wilson et al. abandoned; continued as Ser. No. 08/430,693 and Ser. No. 08/234,817.

BACKGROUND OF THE INVENTION

1. Field of the Invention

The present invention relates to interconnect systems for connecting multiple inkjet pens in an inkjet printer. More specifically, the present invention relates to flexible interconnection circuits used for connecting multiple inkjet pens in an inkjet printer.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

2. Description of the Related Art

Inkjet printer/plotters and desktop printers, such as those sold by Hewlett Packard Company, offer substantial improvements in speed over the conventional X-Y plotter. Inkjet printer/plotters typically include a pen having an array of nozzles. The pens are mounted on a carriage which is moved across the page in successive swaths. Each inkjet pen has heater circuits which, when activated, cause ink to be ejected from associated nozzles. As the pen is positioned over a given location, a jet of ink is ejected from the nozzle to create a pixel at a selected location. The mosaic of pixels thus created provides a composite image.

Inkjet technology is now well known in the art. See, for example, U.S. Pat. No. 4,872,027, entitled PRINTER HAVING IDENTIFIABLE INTERCHANGEABLE HEADS, issued Oct. 3, 1989, to W. A. Buskirk et al. and U.S. Pat. No. 4,965,593, entitled PRINT QUALITY OF DOT PRINTERS, issued Oct. 23, 1990, to M. S. Hickman, the teachings of which are incorporated herein by reference.

Recently, full color inkjet printer/plotters and desktop printers have been developed which comprise a plurality of inkjet pens of diverse colors. A typical color inkjet printer/plotter has four inkjet pens, one that stores black ink, and three that store colored inks, e.g., magenta, cyan and yellow. The colors from the three color pens are mixed to obtain various colors.

The pens are typically mounted in stalls within an assembly which is mounted on the carriage of the printer/plotter. The carriage assembly positions the inkjet pens and typically holds the circuitry required for interfacing to the heater driver circuits in the inkjet pens.

A carriage assembly typically consists of four pen stalls to align the inkjet pens, four pen clamps to hold the inkjet pens in the pen stalls, a printed circuit board with circuitry for interfacing the heater circuits in the inkjet pens, and four separate flexible circuits interconnecting the printed circuit board with electrical contacts on the inkjet pens.

The flex circuit is typically made with a polyester or polyamide material such as a Mylar or Kapton substrate onto which multiple conductors or traces are created. A color inkjet printer with four inkjet pens requires four separate flexible circuits. The use of four separate flex circuits has the disadvantages of: 1) high cost due to the need to manufacture and stock the multiple separate flex circuits; 2) difficulty of assembly because of the need to route the flex circuit in the carriage assembly and precisely align each of the flex circuits to each of the pen housings; 3) high cost of assembly because the separate flex circuits need to be separately interconnected with the printed circuit board; and 4) the need to provide separate grounds for each flex circuit. The requirement of separate grounds for each flexible circuit limits the number of ground interconnects available for an inkjet pen. Moreover, separate ground returns for each pen can cause ground fluctuations and a corresponding pen performance degradation if a large number of heater circuits in one inkjet pen are activated simultaneously.

Accordingly, there was a need in the art for an improved interconnect system that reduced cost, was easy to assemble and align, and provided ground plane sharing for all of the inkjet pens. This need was addressed by U. S. patent application entitled AN IMPROVED UNITARY INTERCONNECT SYSTEM FOR AN INKJET PRINTER, filed Apr. 30, 1993 by A. K. Wilson et al., Ser. No. 08/055,615, the teachings of which are incorporated herein by reference. This application discloses and claims an advantageous flexible circuit (flex circuit) for use with inkjet printers. Unfortunately, this flex circuit has a single pattern of contacts and is therefore limited to use with a single contact configuration.

Accordingly, a need remains in the art for a flex circuit for inkjet pens which is not limited to a single pen type.

SUMMARY OF THE INVENTION

The need in the art is addressed by the present invention which provides a versatile flexible interconnect circuit for use with an inkjet printer. The inventive flexible circuit comprises a unitary flexible substrate having a first end and a second end. A first plurality of contacts is arranged on the first end of the substrate in a first configuration. A first plurality of conductive traces connects the first plurality of contacts to a second plurality of contacts disposed on the second end of the substrate. A third plurality of contacts is arranged on the first end of the substrate in a second configuration. A second plurality of conductive traces connects the third plurality of contacts to a fourth plurality of contacts disposed on the second end of the substrate.

The first and third contact configurations are designed to match the contact configurations of first and second inkjet pen types. Hence, the inventive flex circuit allows for the use of pens with different contact configurations in a single inkjet printer.

In a specific embodiment, the first plurality of contacts includes plural electrical ground contacts and the first plurality of conductive traces includes a conductive trace which connects the electrical ground contacts.

In addition, an inventive method is disclosed for designing the conductive traces. The inventive method includes the steps of providing a first and a second array of contacts and a trace of conductive material around at least one of the first array of contacts. The trace is designed to extend from a first one of the first array of contacts to a first contact of the second array of contacts at a minimum distance from each of the remaining contacts in the first array of contacts.

In a typical application, plural traces are provided. In a first embodiment, each trace is designed with a decreasing width as the trace extends from the first contact of the first array of contacts. In a second embodiment, the width of each trace is adjusted so that the resistance of each trace from one end to another is equal to the resistance of each of the other traces. The novel method provides for an advantageous design methodology in which the flexibility of the circuit is optimized.

DESCRIPTION OF THE INVENTION

Illustrative embodiments and exemplary applications will now be described with reference to the accompanying drawings to disclose the advantageous teachings of the present invention.

Figure 1A:
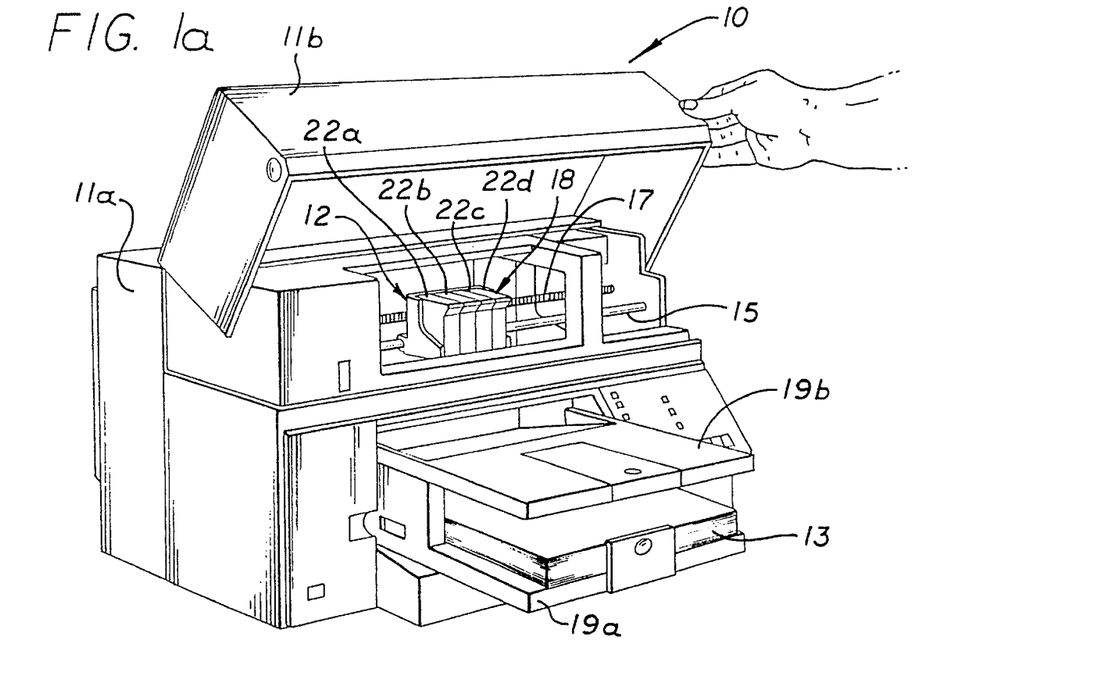
FIG. 1a is a perspective view of a thermal inkjet desktop printer incorporating the teachings of the present invention.

FIG. 1a is a perspective view of a thermal inkjet desktop printer incorporating the teachings of the present invention. The printer 10 includes a housing 11a and a protective front access lid 11b. A carriage assembly 18, is adapted for reciprocal motion along carriage bar 15. The carriage assembly 18 includes a unitary housing 12 which retains three identical inkjet pens 22a, b and c and a dissimilar pen 22d. Each pen includes heater circuits which, when activated, cause ink to be ejected therefrom. One of the pens stores black ink and the remaining three pens store colored inks, e.g., magenta, cyan and yellow. When the pens are activated, the colors from the three color pens are mixed to obtain a desired color. The position of the carriage assembly 18 in the carriage scan axis along carriage bar 15 is determined by a carriage positioning mechanism (not shown). The carriage positioning mechanism is mounted on the carriage assembly 18 and senses its position relative to carriage encoder strip 17. An input tray 19a holds a media input stack 13 and after printing the printed media is held by an output tray 19b.

Figure 1B:
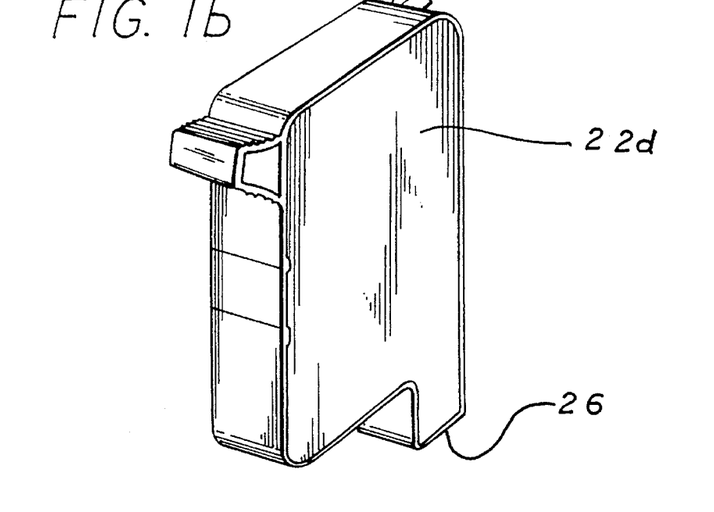
FIG. 1b is a rear perspective view of an inkjet pen.

FIG. 1b is a rear perspective view of an inkjet pen 22d.

Figure 1C:
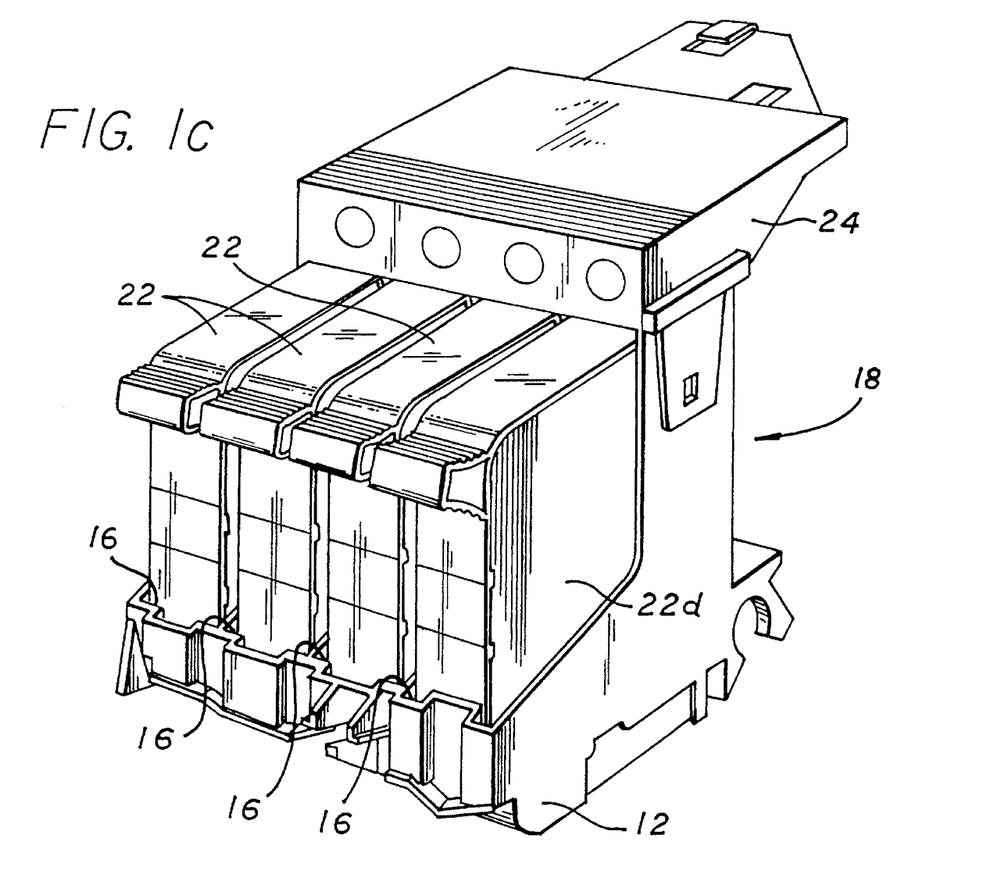
FIG. 1c is a perspective view of the carriage assembly which shows the assembly with the four inkjet pens installed in four pen stalls.

FIG. 1c shows the carriage assembly 18 with the four inkjet pens 22 installed in four pen stalls 16 in unitary housing 12 with cover 24 placed on top.

Figure 2:
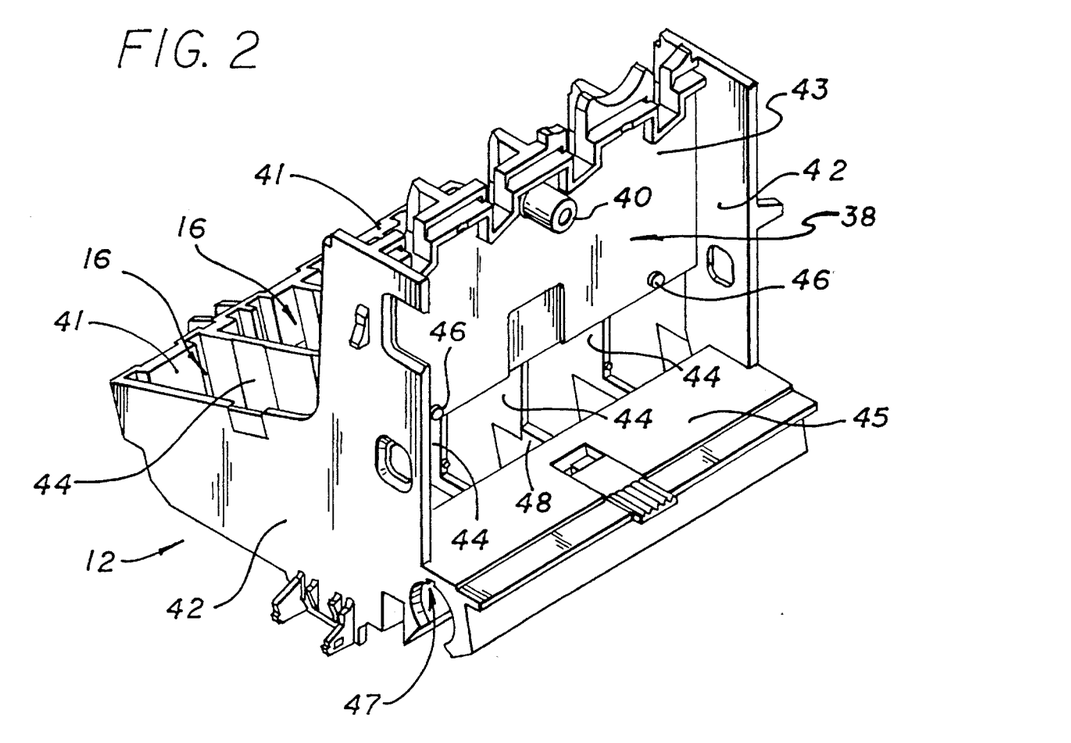
FIG. 2 is a rear perspective view of the unitary housing constructed in accordance with the teachings of the present invention without the pens and the circuit board

FIG. 2 is a rear perspective view of the unitary housing 12 constructed in accordance with the teachings of the present invention without the pens and the circuit board. The unitary housing 12 is of one-piece construction. The housing 12 retains the inkjet pens in a fixed relation to each other on the printer carriage. The unitary housing 12 has a front wall 41, two lateral walls 42, three pen stall walls 44, and rear wall 43, which form four pen stalls 16. It also has a rear compartment 38 formed by lateral walls 42, rear wall 43, base 45, and the spaces between pen stall walls 44 closest to base 45. The four pen stalls 16 have passages that communicate to the rear stall between rear wall 43 and base 45 and between the pen stall walls 44. A first portion 47 integral to the unitary housing 12 extends along a first axis and is adapted to engage the carriage bar 15. The pen stalls 16 each extend along a second axis and are substantially transverse to and integral with the first portion 47. Rear compartment 38, extending along a third axis, is substantially transverse to and integral with the first and second portions and adapted to retain a substantially planar frame circuit assembly 14 within a plane defined by the first and third axes.

Figures 3A, 3B:
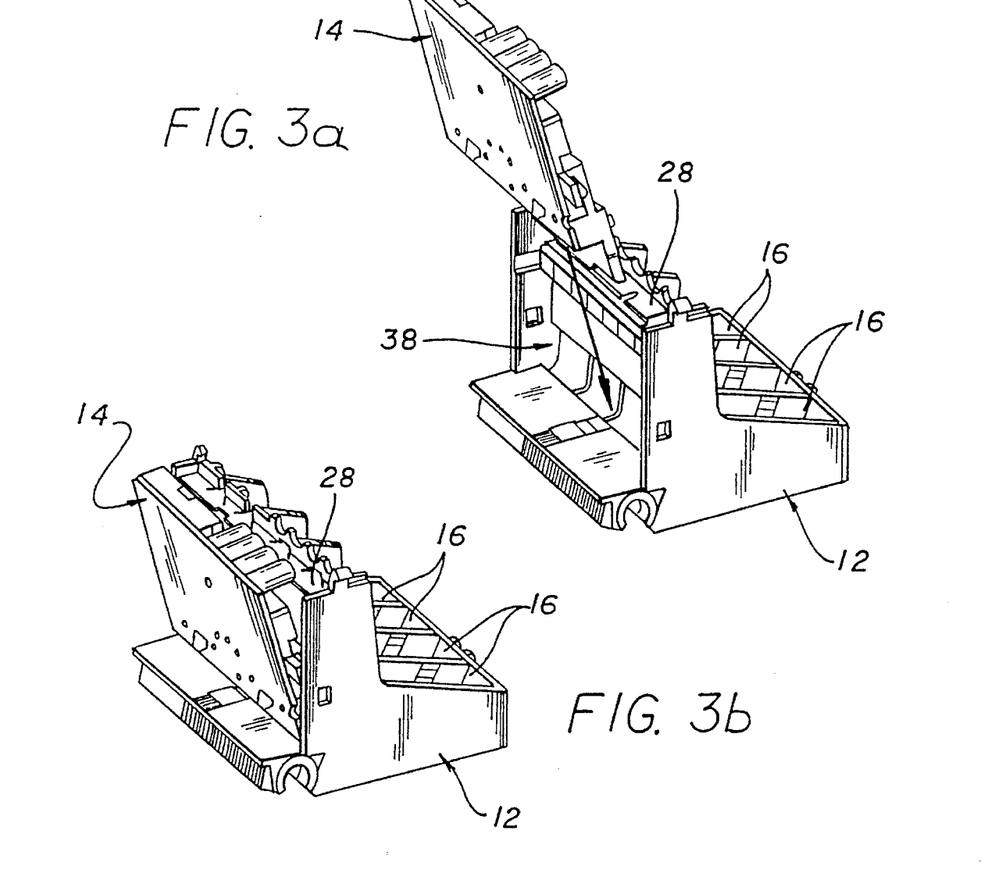
FIGS. 3a–3c are sequential perspective views of the carriage assembly which illustrate how the removable frame circuit assembly of the present invention is installed into the rear compartment in the unitary housing thereof.
Figure 3C:
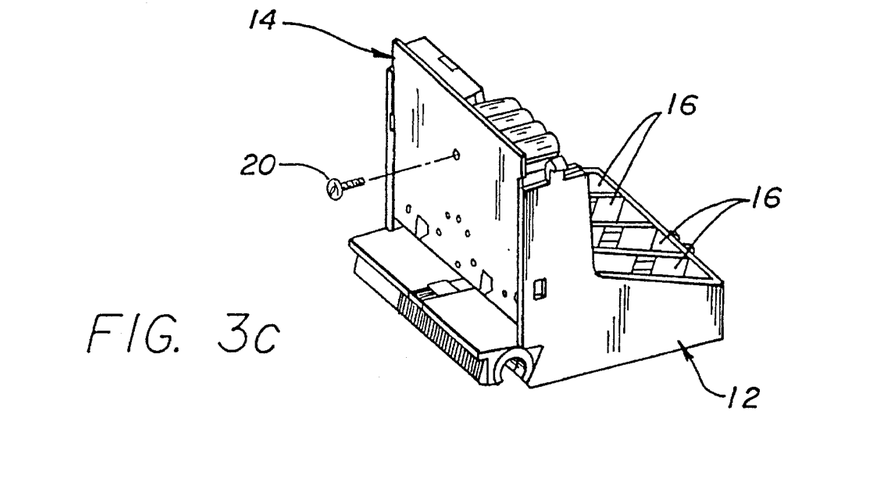

FIGS. 3a–3c illustrate how a removable frame circuit assembly 14 is installed into the rear compartment 38 in unitary housing 12. As illustrated in FIG. 3c, the removable frame circuit assembly 14 is fastened to unitary housing 12 with a single attachment device 20. The single attachment device 20, which can be a simple screw, mates with a single attachment point 40 FIG. 2 on unitary housing 12 to attach the removable frame circuit assembly 14 to the unitary housing 12.

Figure 4A:
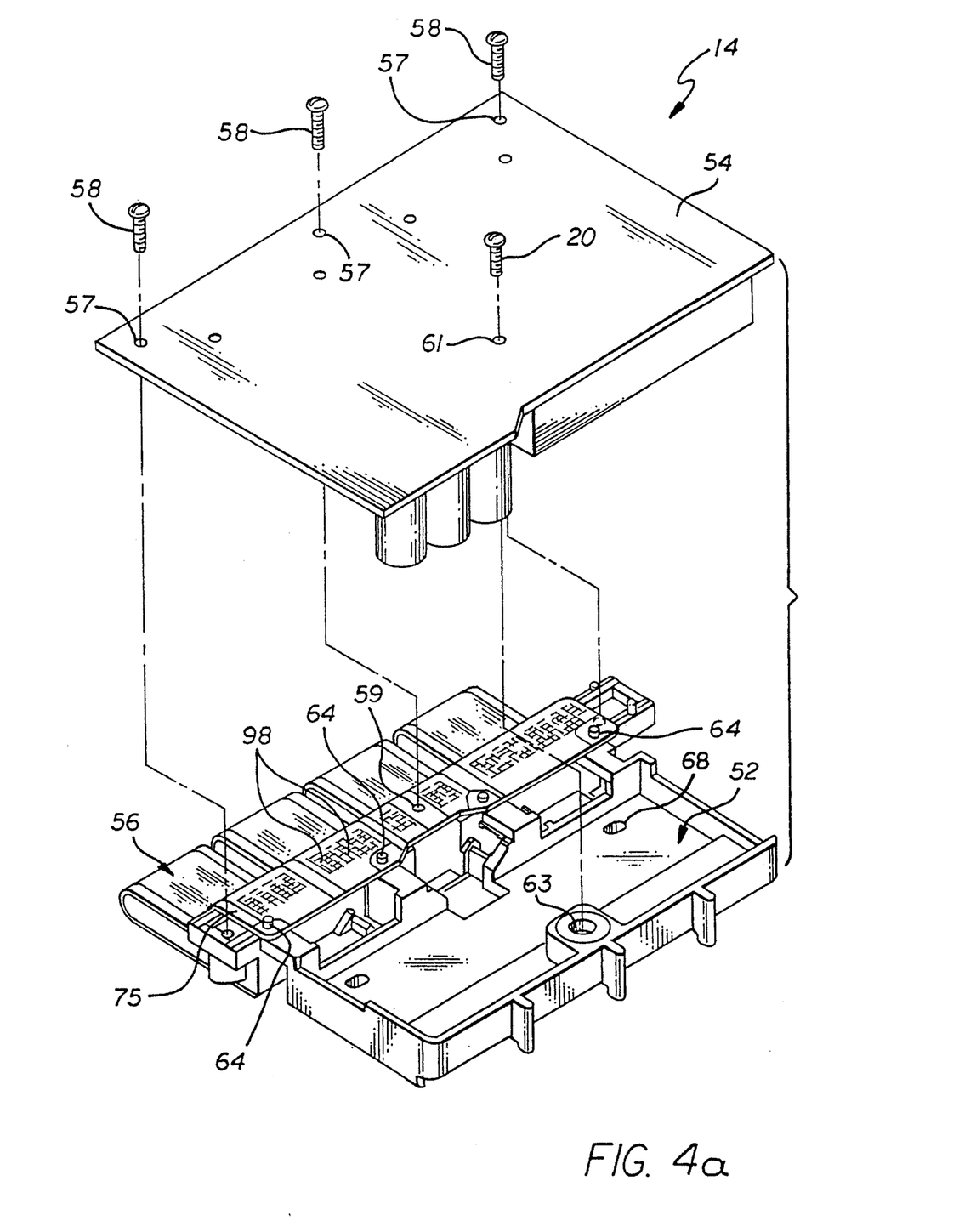
FIG. 4a a perspective view which illustrates how the unitary frame of the inventive arrangement assembles with a circuit board and flexible circuit to form removable frame circuit assembly in accordance with the present teachings.
Figure 4B:
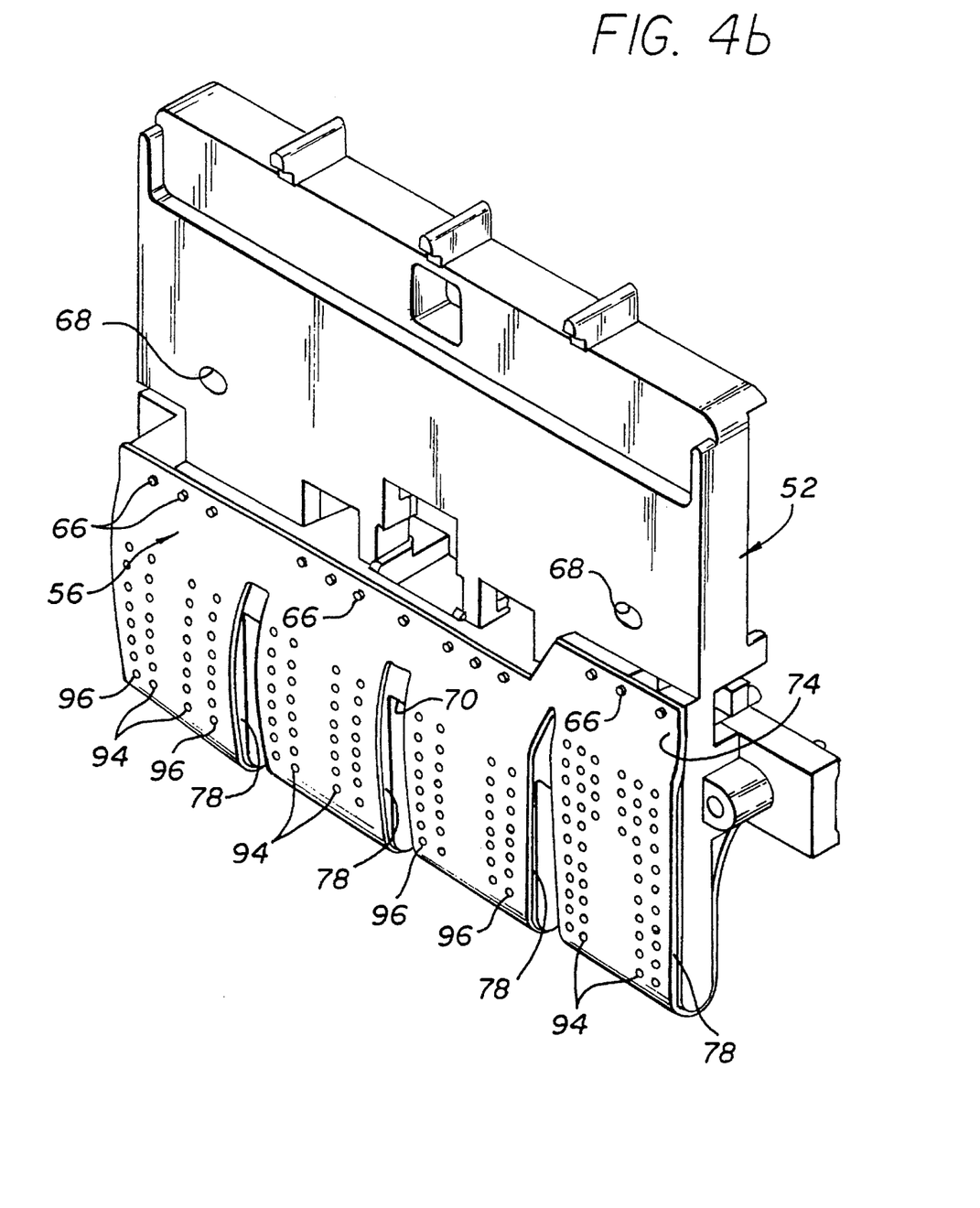
FIG. 4b is a perspective front view of the flexible circuit on the unitary frame.

FIG. 4a illustrates how a unitary frame 52 assembles with a circuit board 54 and flexible circuit 56 to form the removable frame circuit assembly 14 in accordance with the present teachings. FIG. 4b is a frontal perspective view of the flexible circuit 56 on the unitary frame 52.

As shown in FIG. 4a, the circuit board 54 is attached to the unitary frame 52 with devices such as screws 58 that pass through circuit board attachment holes 57 and flexible circuit hole 59 and into unitary frame 52. The single attachment device 20 passes through circuit board attachment hole 61 and unitary frame hole 63, when attaching removable frame circuit assembly 14 to unitary housing 12.

The removable frame circuit assembly 14 should be properly aligned to the unitary housing 12, as electrical contacts (not shown) on the inkjet pens must engage electrical contacts on the removable frame circuit assembly 14 when the pens are mounted in pen stalls 16. The alignment of removable frame circuit assembly 14 to unitary housing 12 is provided by two vertical alignment pins 46 (shown in FIG. 2) for vertical alignment and by a single horizontal alignment wall 48 for horizontal alignment. The vertical alignment pins 46 mate with alignment holes 68 on removable frame circuit assembly 14, shown in FIG. 4b. The single horizontal alignment wall 48 is a vertical wall in unitary housing 12. Alignment slot 70 on removable frame circuit assembly 14, shown in FIG. 4b, slides over and aligns to single horizontal alignment wall 48 when the removable frame circuit assembly 14 is assembled with unitary housing 12.

As illustrated in FIGS. 4a and 4b, the flexible circuit 56 is aligned to unitary frame 52 by alignment pins 64 and 66 on the unitary frame 52. The alignment pins 64 mate with alignment holes 108 FIG. 6 and alignment pins 66 mate with alignment holes 110 FIG. 6. The flex circuit 56 is wrapped over extensions 78 that are on one end of unitary frame 52. As illustrated in FIGS. 2, 3a–c, and 4, when the circuit assembly 14 is installed into unitary housing 12, the extensions 78 slide into the passages between pen stall walls 44 and rear wall 43 and behind base 45. This positions electrical contacts 94, 96 on the flex circuit 52 for interconnection with corresponding electrical contacts (not shown) on the inkjet pens 22.

Figure 5A:
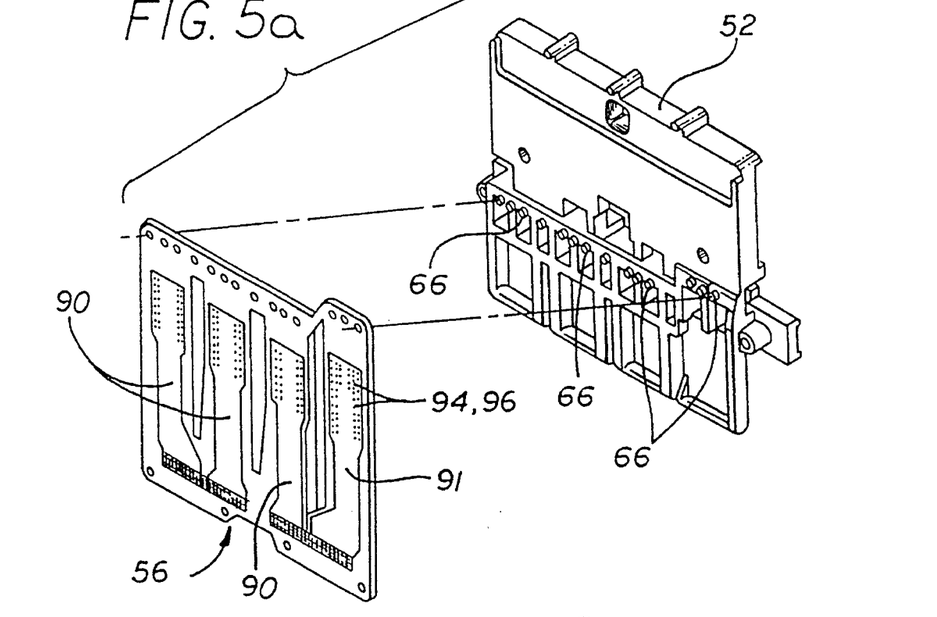
FIGS. 5a is a perspective front view illustrating how the flex circuit assembles onto the unitary frame.
Figure 5B:
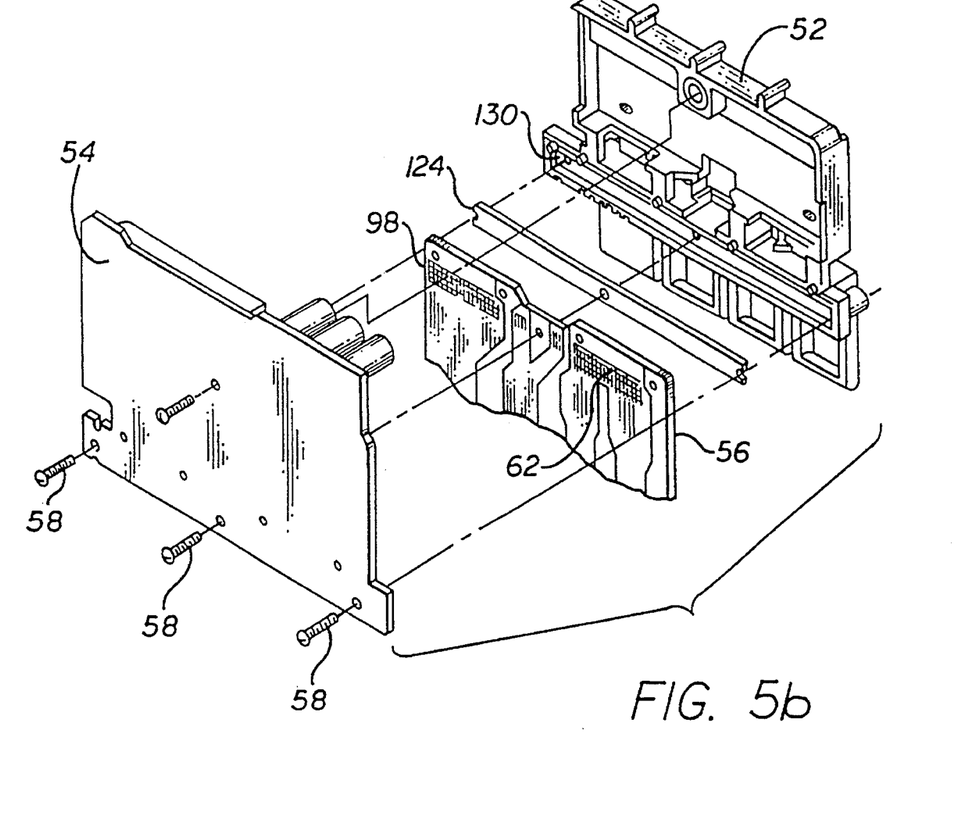
FIG. 5b is a perspective rear view which illustrates how the flexible circuit assembles with the unitary frame and the circuit board to form the removable frame circuit assembly.

FIGS. 5a and 5b are illustrative diagrams showing the assembly of the flex circuit 56 on the unitary frame 52 and the circuit board 54 to form the removable frame circuit assembly 14. As shown in FIG. 5a, the flex circuit 56 is first aligned and attached to unitary frame 52. Then, as shown in FIG. 5b, an elastomeric pad 124 is placed into recess 130 in unitary frame 52. Next, the flex circuit 56 is wrapped over one end of unitary frame 52 and electrical contacts 62 are aligned onto unitary frame 52 and over the elastomeric pad 124. Finally, the circuit board 54 is attached to the unitary frame 52 to make contact with electrical contacts 62 on the flex circuit 56.

Figure 6:
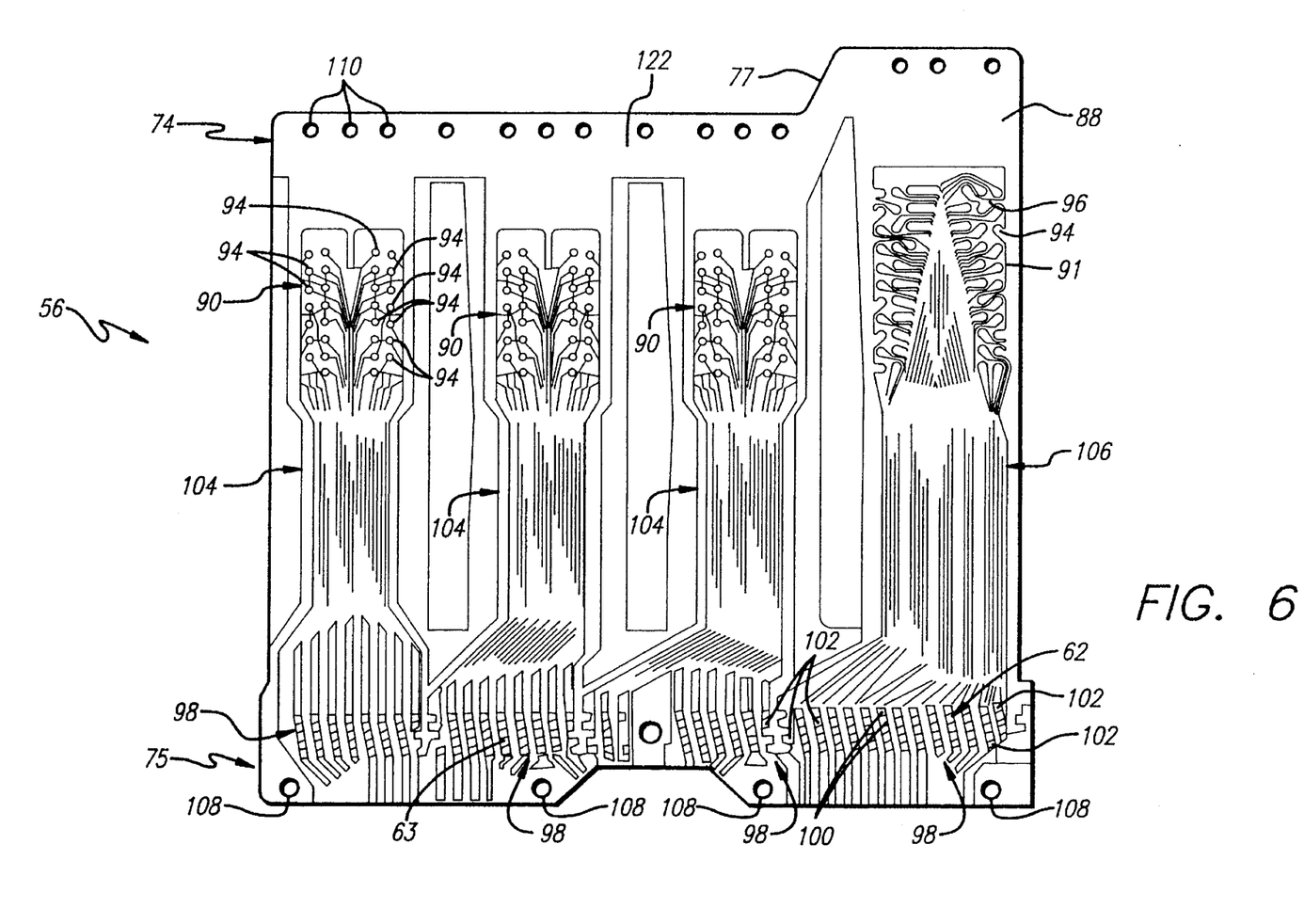
FIG. 6 is an illustrative top plan view of the flexible circuit constructed in accordance with the teachings of the present invention.

FIG. 6 is an illustrative detailed diagram of the flex circuit 56 constructed in accordance with the teachings of the present invention. The flex circuit 56 includes a substrate 88, which has a first end 74 and a second end 75. The flex circuit 56 is constructed with a polyester or polyamide material such as Mylar or Kapton substrate 88 onto which multiple conductors and contacts are created. The conductors and contacts are made of copper. In addition, the contacts are mechanically dimpled and plated with nickel and gold. In accordance with the present teachings, another layer of Mylar or Kapton is provided over each trace so that only the contacts are exposed. The flex circuit 56 has two areas of electrical contacts: electrical contacts 94, 96 on the first end 74 and electrical contacts 62, 63 on the second end 75. The electrical contacts on the second end 62, 63 interconnect with the circuit board 54. The electrical contacts 94, 96 are for electrical interconnection with the inkjet pens 22 held in pen stalls 16. At the first end 74 of the substrate 88, are three identical individual sets of electrical signal and ground contacts 90 and one dissimilar set of contacts 91 for interconnection to the signal contacts on an inkjet pen. An extension 77 is provided on the first end 74 in accordance with the design rules of the inventive method discussed below to accommodate the fourth trace and contact pattern for a dissimilar type of pen. Alignment holes 108 are shown on the second end 75 and holes 110 are shown on the first end 74.

Figure 7A:
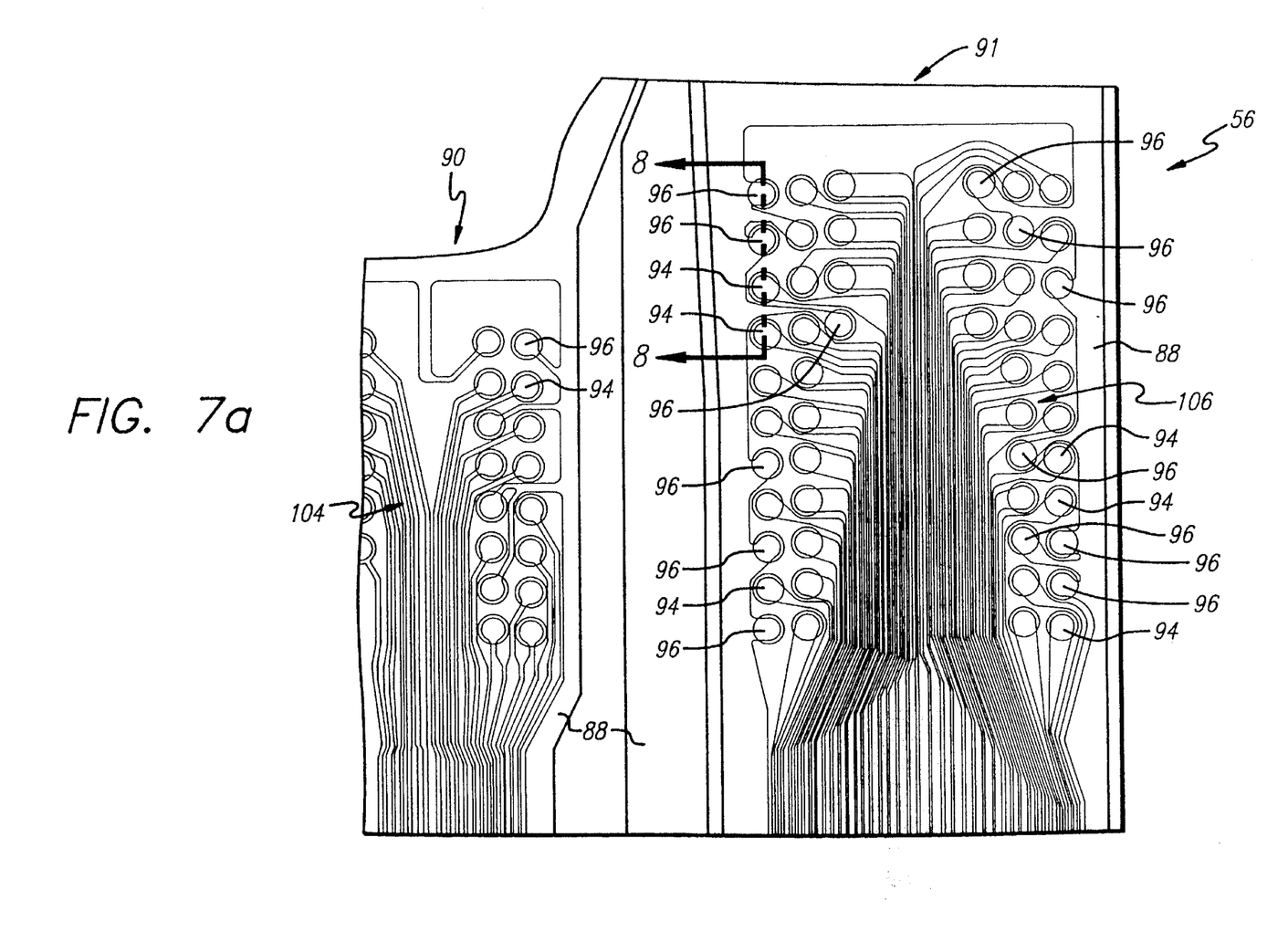
FIG. 7a is a magnified view of a portion of the flexible circuit showing a dissimilar pattern of electrical contacts and associated conductive trace at the first end thereof in accordance with the present teachings.

FIG. 7a is a magnified view of the flex circuit showing the dissimilar pattern of electrical contacts 91 and associated conductive trace at the first end of the substrate 88. Each identical individual set of electrical signal and ground contacts 90, 91 has plural signal contacts 94 and plural electrical ground contacts 96.

At the second end 75 of substrate 88, are four individual sets of electrical signal contacts 98. Three substantially identical electrical trace patterns 104 connect the contacts 94 and 96 with the contacts 98.

Figure 7B:
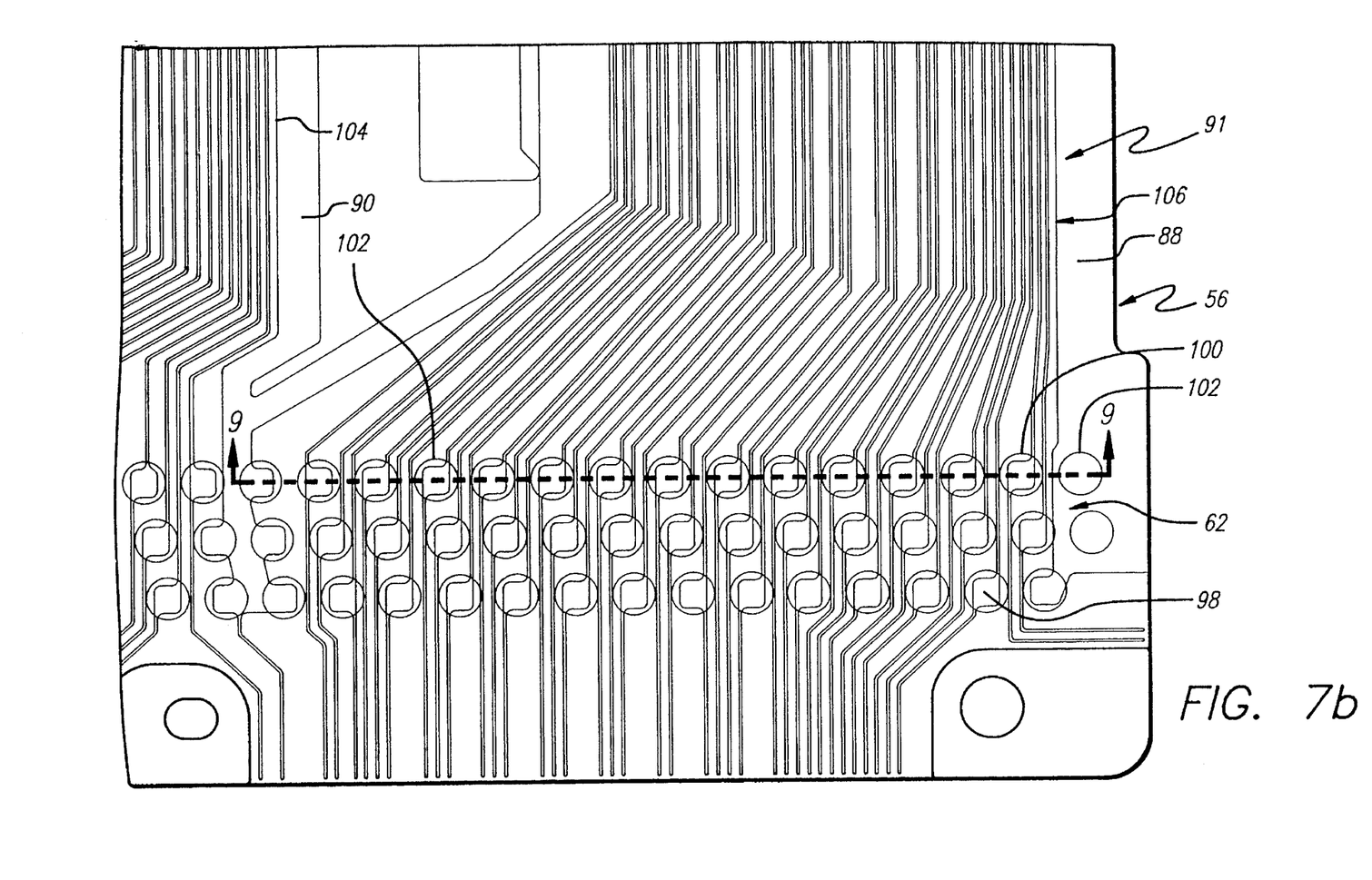
FIG. 7b is a magnified view of a portion of the flexible circuit showing the dissimilar pattern of electrical contacts at the second end thereof.

FIG. 7b is a magnified view of the dissimilar pattern of electrical contacts at the second end of the flex circuit 56. As shown in FIG. 7b, the dissimilar trace pattern 106 connects the contacts 94 and 96 to the contacts 62 of the dissimilar pattern 91. In FIGS. 7a and 7b, each line represents the edge of the trace.

The three similar patterns 104 are identical with the exception of the lower portions thereof which may be shifted to line-up with associated contacts 98.

In accordance with the inventive method, the pattern of conductive material or trace 106 at the first end of the circuit 56 is made in accordance with the following design rules. The conductive material is created through each of the contacts 91 while maintaining a minimum keep-out radius around each contact. This serves to maintain the flexibility of the circuit 56. The width of each trace is controlled so that the resistance of each trace is equal to the resistance of the other traces. The width of each trace is maximized near the associated contact while that from neighboring contacts is thinned. The taper is designed with the realization that the width of the trace determines the susceptibility of the trace to breakage as well as the fact that the more conductive material is deposited on the substrate, the more stiff the circuit becomes. Ideally, the contacts, which are raised as protrusions or dimples, should float independent from the neighboring dimples. Finally, the ground contacts are shorted together.

The length of the mid-section of each trace is determined in accordance with the wrap-around distance around the end of the unitary frame 52.

Figure 8:
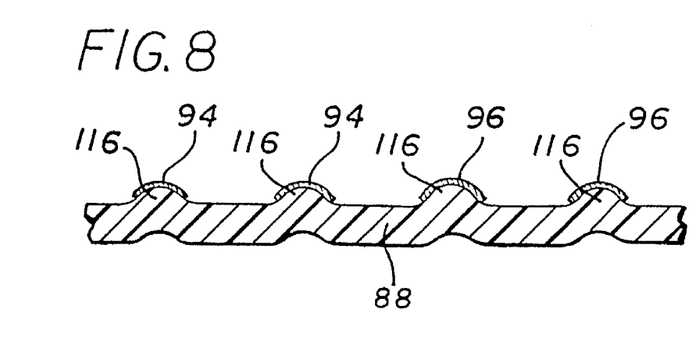
FIG. 8 is a sectional side view taken along section 8—8 of FIG. 7a showing protrusions on the substrate of the flexible circuit.

FIG. 8 is an illustrative diagram of section 8—8 of FIG. 7a showing protrusions 116 on substrate 88 constructed in accordance with the present invention. As shown in FIG. 8, electrical signal contacts 94 and electrical ground contacts 96 are provided on protrusions 116.

Figure 9:
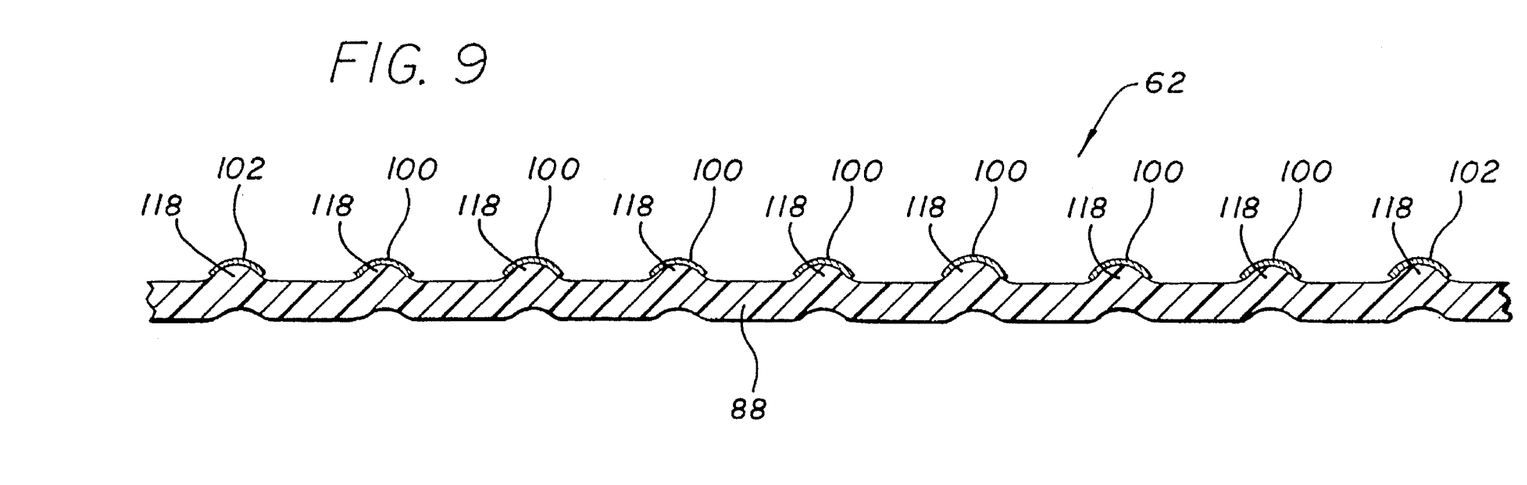
FIG. 9 is a sectional side view taken along section 9—9 of FIG. 7b showing protrusions on the substrate of the flexible circuit.

Similarly, FIG. 9 is an illustrative diagram of a section 9—9 of FIG. 7b showing protrusions 118 on substrate 88. As shown in FIG. 9, contacts 62 include signal contacts 100 and ground contacts 102 on protrusions 118. The electrical contacts on protrusions 116 make contact with corresponding electrical contacts on the inkjet pens 22 and electrical contacts on protrusions 118 make contact with corresponding electrical contacts on circuit board 54.

Figure 10:
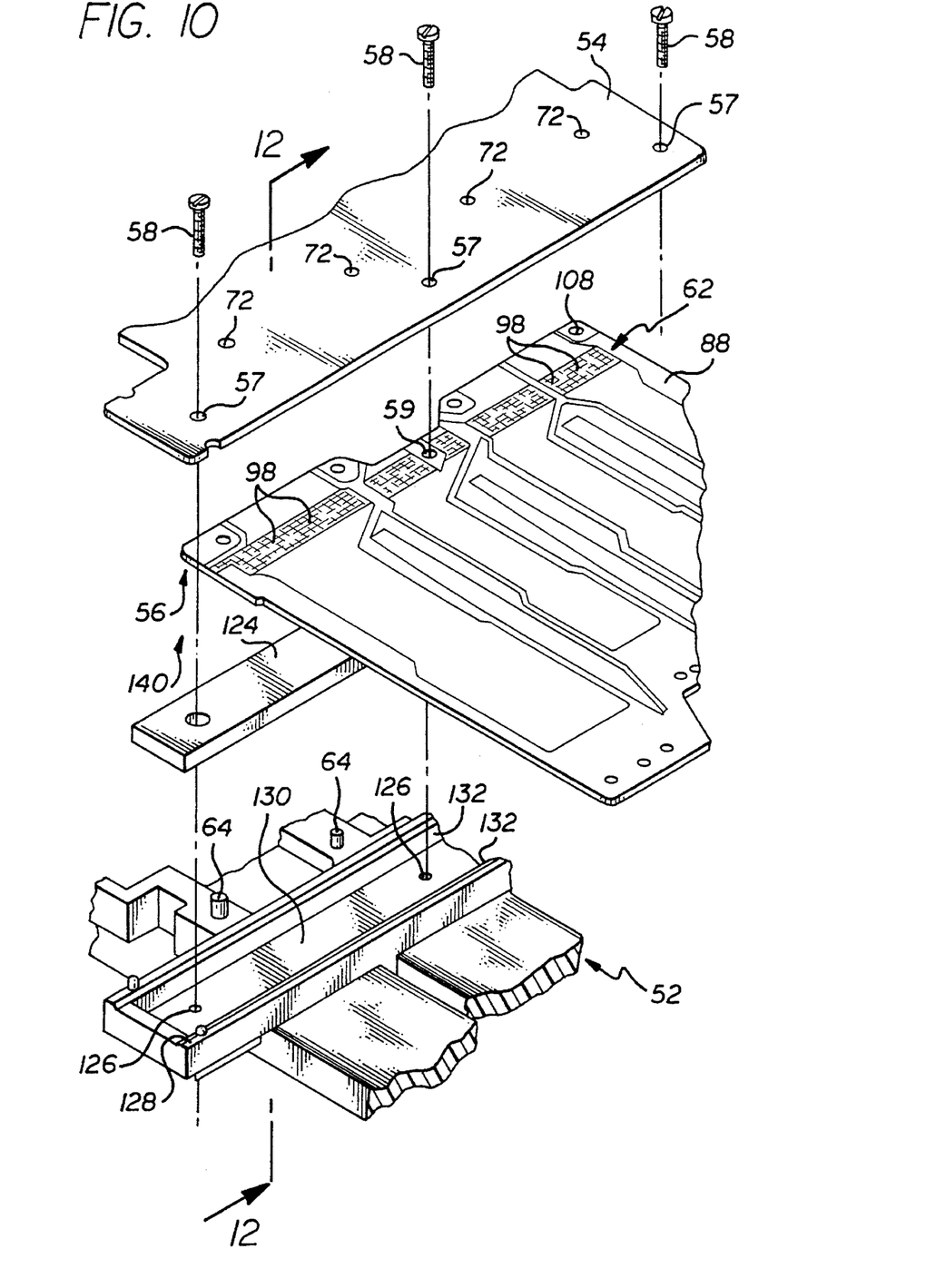
FIG. 10 is an assembly view showing the circuit board, flexible circuit, elastomeric pad, and plastic support of the present invention.

In FIG. 10 the interconnect system 140 for the flex circuit 56 and the circuit board 54 is shown in an assembly view. Electrical contacts 62 are located on protrusions 118 on substrate 88, as shown in FIG. 9. As shown in FIG. 10, the circuit board 54 and flex circuit 56 are assembled on a unitary frame 52. The frame 52 may be constructed of plastic or other suitable material. A low pressure is effective to interconnect the circuit board contacts 134 and electrical contacts 98. An elastomeric pad 124, which can be constructed of urethane rubber, provides a spring force and is mounted into recess 130 in unitary frame 52. The elastomeric pad 124 should be resistant to creep. The electrical interconnect system 140 is assembled with screws 58 that are inserted through circuit board attachment hole 57 on circuit board 54 and flex circuit hole 59 on flex circuit 56. The screws are then secured into attachment holes 126 on the unitary frame 52.

As mentioned above, the electrical contacts 62 on the flex circuit 56 are aligned to circuit board contacts 134 on circuit board 54 by alignment pins 64 coupled to unitary frame 52. The alignment pins 64 are inserted through alignment holes 108 on the flex circuit 56 and alignment holes 72 on circuit board 54. When the electrical interconnect system is assembled the electrical contacts 62 are aligned and make electrical contact with circuit board contacts 134. A minimum distance is provided between the beginning of the trace and the alignment holes. This allows for a flexing or bowing of the flex circuit in response to contact pressure to allow for contact of the electrical contacts thereof with corresponding electrical contacts on the circuit board 54. The provision of the extension 77 for the dissimilar pattern 91 allows for a different degree of flexure of the section of the flex circuit 56 on which the dissimilar pattern 91 is deposited.

Figure 11:
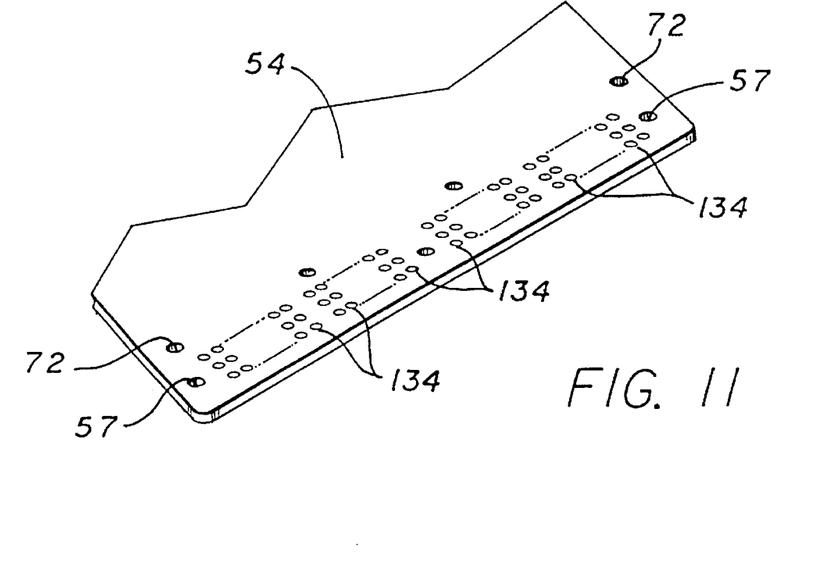
FIG. 11 is a partial perspective view of the circuit board showing contacts on one side thereof which interconnect with corresponding electrical contacts on the flexible circuit.

FIG. 11 shows the opposite side of circuit board 54 with circuit board contacts 134 which interconnect with corresponding electrical contacts 62 on flex circuit 56. The arrangement of circuit board contacts 134 on circuit board 54 correspond to the arrangement of electrical contacts 62 on the flex circuit 56. Each of the circuit board contacts 134 are gold plated and the electrical contacts 62 are also gold plated to insure a low resistance electrical path.

Figure 12:
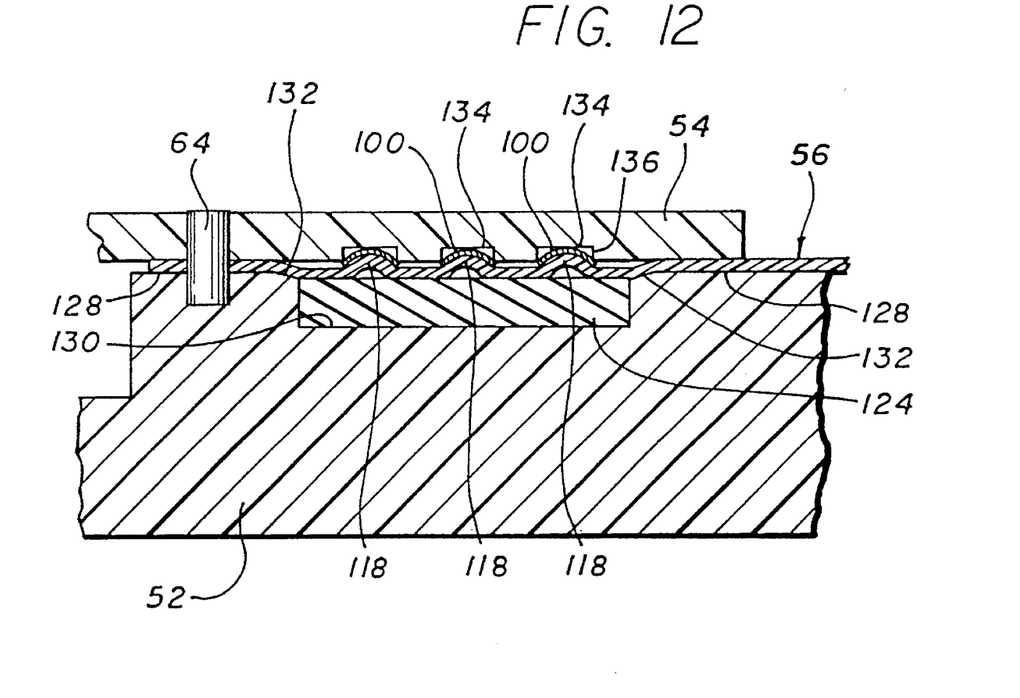
FIG. 12 is a sectional side view taken along line 12—12 of FIG. 10 showing the interconnect system of the present invention in assembled relation.

FIG. 12 is an illustrative diagram of an elevation section along line 12—12 of FIG. 10 of an assembled improved electrical interconnect system for the flex circuit constructed in accordance with the present invention. In FIG. 12 the elastomeric pad 124 is shown to fit within recess 130 in the unitary frame 52. The elastomeric pad 124 provides a spring force that pushes upon the electrical contacts 100 on protrusions 118 between the elastomeric pad 124 and the circuit board 54. The unitary frame 52 has bevels 132 between the recess 130 and the top surface 128 of the unitary frame 52. The object of each bevel 132 is to provide relief allowing the flex circuit 56 to deform during assembly so that all of the electrical contacts 100 on protrusions 118 make contact with all of the circuit board contacts 134 on circuit board 54. As the screws 58 are tightened, a portion of the flex circuit 56 is clamped between the top surface 128 of unitary frame 52 and the circuit board 54. Bevels 132 provide relief to the portion of flex circuit 56 between elastomeric pad 124 and circuit board 54.

Also shown in FIG. 12 are circuit contact recesses 136, which contain circuit board contacts 134. The circuit contact recesses 136 on circuit board 54 are the result of a coating such as a solder mask that is applied over the conductors on circuit board 54 to protect the conductors from corrosion and to prevent solder bridging. This allows for slight circuit contact recesses 136 on the order of 0.001–0.002 inches deep at each of the circuit board contacts 134, which as discussed above are gold plated. During assembly, the portion of flex circuit 56 between elastomeric pad 124 and circuit board 54 deforms, which allows the protrusions 118 on flex circuit 56 to align with the circuit contact recesses 136 on circuit board 54 to ensure proper electrical contact.

Thus, the present invention has been described herein with reference to a particular embodiment for a particular application. Nonetheless, those having ordinary skill in the art and access to present teachings will recognize additional modifications, applications, and embodiments within the scope thereof.

It is therefore intended by the appended claims to cover any and all such applications, modifications and embodiments within the scope of the present invention.

Accordingly,

What is claimed is:

1. A flexible interconnect circuit having a flexible substrate, a plurality of contacts, and a plurality of conductive traces interconnecting the plurality of contacts on the flexible substrate of the flexible interconnect circuit, comprising:

a first array of contacts and a second array of contacts, each of said arrays located at terminal ends of said substrate; and at least one trace connecting said arrays such that said trace comprises conductive material connecting at least a first one contact of the first array of contacts to at least one contact of the second array of contacts such that said trace extends from said at least one first one of the contacts of said first array of contacts to a first contact of the second array of contacts at a minimum distance from each other proximate contact, such that each trace has a decreasing width as the trace extends from the first contact of the first array of contacts.

2. The invention of claim 1 further comprising:

plural traces of conductive material, each trace extending from one contact of a first plurality of contacts in said first array of contacts to one contact of a second plurality of contacts in said second array of contacts.

3. The invention of claim 2 further comprising:

the width of each trace is dimensioned such that the resistance of each trace from one end to another is equal to the resistance of each of the other traces.

4. A unitary flexible interconnection circuit for providing an electrical connection of a plurality of inkjet pens in an inkjet printer, said pens having differing electrical contact configurations, said flexible circuit comprising:

a unitary flexible substrate having a first end and a second end;

a first set of first electrical contacts disposed at said first end of said substrate in a first configuration;

a second set of first electrical contacts disposed at said first end of said substrate in a second configuration;

plural sets of second electrical contacts disposed at said second end of said substrate; and plural traces of conductive material connecting said first electrical contacts to said second electrical contacts, wherein said first set of first electrical contacts and said second set of first electrical contacts are adapted to engage corresponding contacts on said inkjet pens.

5. An inkjet printer comprising:

a first, second, third and fourth inkjet pens having first, second, third and fourth pen electrical contacts respectively, at least one of said pens having a first configuration array of pen electrical contacts arranged in a first configuration and at least a second of said pens having a second configuration array of pen electrical contacts arranged in a second configuration that is different from said first configuration;

an electrical circuit for selectively driving said inkjet pens; and a unitary flexible interconnection circuit connecting said electrical circuit to each of said inkjet pens via respective said pen electrical contacts, said flexible circuit including, a unitary flexible substrate having a first end and a second end;

a first set of first flex circuit electrical contacts disposed at said first end of said substrate in said first configuration;

a second set of first flex circuit electrical contacts disposed at said first end of said substrate in said second configuration;

plural sets of second flex circuit electrical contacts disposed at said second end of said substrate; and plural traces of conductive material connecting said first flex circuit electrical contacts to said second flex circuit electrical contacts.

6. A method of connecting a plurality of inkjet pens to an electronic circuit including the steps of:

a) providing a first array of first contacts on one of said plurality of inkjet pens in a first configuration and a second array of first contacts on one of said inkjet pens in a second configuration;

b) providing a first array of second contacts in said first configuration and a second array of second contacts in said second configuration at a first end of a unitary flexible interconnection circuit whereby each of said arrays of second contacts are configured to engage a corresponding array of said first contacts;

c) providing a third array of third contacts at a second end of said flexible interconnection circuit;

d) providing a plurality of traces of conductive material between each of said second contacts and one of said third contacts;

e) providing a fourth array of fourth contacts on said electronic circuit configured to match said third array of contacts; and f) assembling said inkjet pens, said flexible interconnect circuit and said electronic circuit whereby each contact in said first array of contacts is in electrical contact with a corresponding contact in said second array of contacts and each contact in said third array of contacts is in electrical contact with a corresponding contact in said fourth array of contacts.

* * * * *